US006570299B2

(12) United States Patent
Takeshima et al.

(10) Patent No.: US 6,570,299 B2
(45) Date of Patent: May 27, 2003

(54) PIEZOELECTRIC ELECTROACOUSTIC TRANSDUCER AND MANUFACTURING METHOD OF THE SAME

(75) Inventors: Tetsuo Takeshima, Toyama (JP); Manabu Sumita, Fukui-ken (JP); Kiyotaka Tajima, Toyama (JP); Yuichi Sakai, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/156,860

(22) Filed: May 30, 2002

(65) Prior Publication Data

US 2002/0195901 A1 Dec. 26, 2002

(30) Foreign Application Priority Data

Jun. 26, 2001 (JP) .................................... 2001-193305

(51) Int. Cl.$^{7}$ .......................................... H01L 41/053

(52) U.S. Cl. ...................... 310/348; 310/324; 310/366; 310/345; 29/25.35

(58) Field of Search ............................. 310/324, 348, 310/365, 366, 345, 330; 29/25.35

(56) References Cited

U.S. PATENT DOCUMENTS 6,420,818 B1 * 7/2002 Kishimoto et al. ......... 310/324
2001/0004180 A1 * 6/2001 Kishimoto .................. 310/324

FOREIGN PATENT DOCUMENTS

JP 2000-310990 11/2000 .......... G10K/9/122

* cited by examiner

*Primary Examiner*—Thomas M. Dougherty
(74) *Attorney, Agent, or Firm*—Keating & Bennett, LLP

(57) ABSTRACT

A piezoelectric electroacoustic transducer includes a substantially square piezoelectric diaphragm flexually vibrating in a plate-thickness direction in response to application of an alternating signal between electrodes, a substantially rectangular insulating case having a supporting member disposed inside sidewalls of the case for supporting the diaphragm, terminals having internal connections exposed in a vicinity of the supporting member and external connections exposed outside the case and electrically connecting to the internal connections, a first adhesive applied to a shortest route located between the external periphery of the diaphragm and the internal connections and connecting the diaphragm to the internal connections so as to fix the diaphragm to the case, a conductive adhesive applied to electrodes of the diaphragm and the internal connections via the upper surface of the first adhesive by detouring from the shortest route to connect the diaphragm to the internal connections for electrically connecting the electrodes of the diaphragm to the internal connections of the terminals, and a second adhesive for sealing a clearance between the external periphery of the diaphragm and the internal periphery of the case. The first and second adhesives have a Young's modulus after curing smaller than that of the conductive adhesive.

20 Claims, 7 Drawing Sheets

PIEZOELECTRIC ELECTROACOUSTIC TRANSDUCER AND MANUFACTURING METHOD OF THE SAME

BACKGROUND OF THE INVENTION

1. Field of the Invention

The present invention relates to a piezoelectric electroacoustic transducer such as a piezoelectric buzzer and piezoelectric receiver, and a manufacturing method thereof.

2. Description of the Related Art

In previous electronic devices, such as electronic home appliances and portable telephones, piezoelectric electroacoustic transducers have been used as piezoelectric buzzers or piezoelectric receivers for producing an alarm sound or operating sound. A conventional piezoelectric electroacoustic transducer includes a circular piezoelectric element that is bonded on one surface of a circular metallic plate to define a unimorph-type diaphragm, the periphery of the metallic plate is supported with silicone rubber in a circular case, and an opening of the case is closed with a cover.

However, with a circular diaphragm, production efficiency and acoustic conversion efficiency is relatively low, and the size of the piezoelectric electroacoustic transducer cannot be sufficiently reduced.

A piezoelectric electroacoustic transducer that includes a square diaphragm and achieves improved production efficiency, improved acoustic conversion efficiency and a reduced size, is disclosed in Japanese Unexamined Patent Application Publication No. 2000-310990. The piezoelectric electroacoustic transducer includes a square piezoelectric diaphragm, an insulating case having a bottom wall, four sidewalls, and a supporting member disposed inside two of the sidewalls opposing each other for supporting the diaphragm, the supporting member being provided with first and second conductive portions for external connection, and a lid plate having holes provided therein for releasing sound. The diaphragm is accommodated within the case such that two opposing sides of the diaphragm are fixed to the supporting member with an adhesive or an elastic sealant, while gaps between the remaining two sides of the diaphragm and the case are sealed with the elastic sealant, such that the diaphragm and the first and second conductive portions are electrically connected together via a conductive adhesive, and the lid plate is bonded on the open end of the side-wall of the case.

In recent years, the diaphragm thickness of the piezoelectric electroacoustic transducer has been greatly reduced, and a diaphragm having a thickness of approximately several tens to 100 $\mu$m is used. When using such a reduced-thickness diaphragm, the structure for supporting the diaphragm greatly influences the frequency characteristics.

For example, when directly connecting the diaphragm to an external electrode with a thermosetting conductive adhesive, such as urethane, a strain is produced in the diaphragm due to the curing and contraction stress of the conductive adhesive, such that the frequency characteristics are changed. Also, when the ambient temperature changes, the characteristics change due to the difference in thermal expansion coefficients of the case and the diaphragm, and when an external force is directly applied to the case, the force is also directly transmitted to the diaphragm, such that the characteristics change.

After fixing the diaphragm to the case with an elastic supporting material as described above, even when coating the diaphragm and case with the conductive adhesive, if the shortest distance between the two sides opposing each other of the diaphragm and a supporting member of the case, i.e., an internal connection portion for electrical connection to an external electrode, is coated with the conductive adhesive, a stress caused by the curing and contraction of the conductive adhesive is applied to the diaphragm, such that variations in the frequency characteristics are produced.

SUMMARY OF THE INVENTION

In order to overcome the above-described problems, preferred embodiments of the present invention provide a piezoelectric electroacoustic transducer and a manufacturing method thereof, in which stability of the frequency characteristics is achieved by selectively coating locations of an adhesive for fixing a diaphragm to a case and of a conductive adhesive for electrical connection, so as to prevent stress being imparted to the diaphragm.

A first preferred embodiment of the present invention provides a piezoelectric electroacoustic transducer which includes a substantially square piezoelectric diaphragm having electrodes and flexurally vibrating in a plate-thickness direction in response to application of an alternating signal between the electrodes, a substantially rectangular insulating case having a supporting member disposed inside sidewalls of the case for supporting the piezoelectric diaphragm, terminal electrodes having internal connections exposed in the vicinity of the supporting member and external connections exposed on the external surface of the case and electrically connected to the internal connections, a first adhesive which is applied to a shortest route connecting the piezoelectric diaphragm to the internal connections, the shortest route being located between the external periphery of the piezoelectric diaphragm and the internal connections, so as to fix the piezoelectric diaphragm to the case, a conductive adhesive for electrically connecting the electrodes of the piezoelectric diaphragm to the internal connections of the terminal electrodes, the conductive adhesive being applied between the electrodes of the piezoelectric diaphragm and the internal connections via the upper surface of the first adhesive by detouring from the shortest connection route between the piezoelectric diaphragm and the internal connections, and a second adhesive for sealing a gap between the external periphery of the piezoelectric diaphragm and the internal periphery of the case, wherein the first and second adhesives have a Young's modulus after curing less than that of the conductive adhesive.

A second preferred embodiment of the present invention provides a method for manufacturing a piezoelectric electroacoustic transducer, which includes the steps of preparing a substantially square piezoelectric diaphragm flexurally vibrating in a plate-thickness direction in response to application of an alternating signal between electrodes, preparing a substantially rectangular insulating case having a supporting member disposed inside sidewalls of the case for supporting the piezoelectric diaphragm and terminal electrodes having internal connections exposed in a vicinity of the supporting member and external connections exposed outside the case and electrically connected to the internal connections, applying a first adhesive to a shortest route connecting the piezoelectric diaphragm to the internal connections, the shortest route being located between the external periphery of the piezoelectric diaphragm and the internal connections, so as to fix the piezoelectric diaphragm to the case by curing the first adhesive, applying a conductive adhesive between the electrodes of the piezoelectric diaphragm and the internal connections via the upper surface of the first adhesive by detouring from the shortest connection route between the piezoelectric diaphragm and the internal connections so as to electrically connect the electrodes of the piezoelectric diaphragm to the internal connections of the terminal electrodes by curing the conductive adhesive, and applying a second adhesive in a gap between the external periphery of the piezoelectric diaphragm and the internal periphery of the case so as to seal both of the peripheries by curing the second adhesive, wherein the first and second adhesives have a Young's modulus after curing that is less than that of the conductive adhesive.

According to preferred embodiments of the present invention, after fixing the external periphery of the diaphragm and the internal connections of the terminal electrodes with the first adhesives, the electrodes of the piezoelectric diaphragm and the internal connections of the terminal electrodes are electrically connected together with the conductive adhesives. At this time, the first adhesive is applied and cured to the shortest routes between the piezoelectric diaphragm and the internal connections, which are located between the external periphery of the piezoelectric diaphragm and the internal connections, while the conductive adhesive is applied and cured thereon via the upper surfaces of the first adhesives by detouring from the shortest route between the piezoelectric diaphragm and the internal connections. Since the first adhesive has a Young's modulus after curing that is less than that of the conductive adhesive, the stress caused by the curing and contraction of the conductive adhesive is relieved by the first adhesive, such that the stress is not directly applied to the piezoelectric diaphragm. Therefore, the strain is not produced in the piezoelectric diaphragm which eliminates variations in frequency characteristics. Even when the ambient temperature is changed or an external force is applied to the case, the stress is relieved by the first adhesive, such that the stress does not affect the piezoelectric diaphragm, thus preventing frequency characteristics from varying.

When manufacturing the piezoelectric electroacoustic transducer according to preferred embodiments of the present invention, the first adhesive may be applied after the piezoelectric diaphragm is provided within the case, or before the piezoelectric diaphragm is provided within the case, the first adhesive may be applied to the external periphery of the piezoelectric diaphragm or in the vicinity of the supporting member of the case. In the former case, the first adhesive is applied preferably using a dispenser, whereas in the latter case, the first adhesive is applied preferably using not only the dispenser but also a trowel, the first adhesive may be applied to end portions of the piezoelectric diaphragm so as to bond and fix the piezoelectric diaphragm within the case.

Preferably, the viscosity of the first adhesive before curing is greater than that of the second adhesive such that the first adhesive is more difficult to spread.

That is, when the first adhesive spreads easily because of low viscosity in the uncured state, the first adhesive may clog up the electrode of the piezoelectric diaphragm and the internal connections of the terminal electrodes, such that it is difficult to electrically connect the electrode of the piezoelectric diaphragm to the internal connections of the terminal electrodes when applying the conductive adhesives. Further, if the viscosity of the first adhesive is low, the first adhesive may not remain in the shortest connecting route between the external periphery of the piezoelectric diaphragm and the internal connections of the terminal electrodes. Thus, by using a first adhesive having high viscosity, such problems are solved, such that the piezoelectric diaphragm and the terminal electrodes are securely connected together with the conductive adhesives by detouring from the shortest route.

Preferably, the first adhesive is partially applied to vicinities of four corners of the piezoelectric diaphragm.

When using a thermosetting adhesive as the first adhesive, the deformation increases toward the center of four sides of the case, and the stress applied to the piezoelectric diaphragm is primarily exerted on the central portions of the four sides.

Whereas, when the first adhesive is partially applied to vicinities of four corners of the piezoelectric diaphragm, the deformation of the case during the curing of the first adhesive is greatly reduced, which substantially eliminates the effect on the piezoelectric diaphragm.

Preferably, the conductive adhesive is applied to vicinities of at least two of four corners of the piezoelectric diaphragm.

When the first adhesive is partially applied to vicinities of four corners of the piezoelectric diaphragm as described above, the strain in the piezoelectric diaphragm is greatly reduced. Moreover, when conductive adhesive is applied to vicinities of at least two of four corners of the piezoelectric diaphragm, the influence of the strain caused by the curing and contraction of the conductive adhesive is further reduced.

In the diaphragm, bending vibration in a length-bending mode and bending vibration in an area-bending mode is produced, corresponding to the manner of supporting the diaphragm. The former is a mode of bending-vibration in the plate-thickness direction when both lateral ends are supported and the latter is a mode in which the entire area of the diaphragm flexually vibrates in the plate-thickness direction when the four sides or the four corners are supported such that a position along the two diagonal lines on the principal surface of the diaphragm has the maximum displacement, i.e., the intersection of the diagonal lines has the maximum displacement.

According to the present invention, a urethane conductive paste is preferably used as the conductive adhesive. As the first adhesive, a material having a Young's modulus after curing that is less than that of the conductive adhesive is preferably used, such as a urethane adhesive. As the second adhesive, a material having a Young's modulus that is less than that of the first adhesive and having small curing contraction stress is preferably used, such as a silicone adhesive.

In addition, as the first and second adhesives, a cold-setting adhesive may alternatively be used. However, when applying it with a dispenser, because curing begins during coating, the dispenser is liable to clog up, which reduces work efficiency. Whereas the thermosetting adhesive has an advantage that the viscosity does not change during coating such that the dispenser does not clog up, which greatly improves work efficiency, because of its constant viscosity at the room temperature.

Other feature, elements, characteristics and advantages of the present invention will become more apparent from the following detailed description of preferred embodiments of the present invention with reference to the attached drawings.

DETAILED DESCRIPTION OF PREFERRED EMBODIMENTS

FIGS. 1 to 5 show a surface-mount piezoelectric electroacoustic transducer according to a first preferred embodiment of the present invention.

The electroacoustic transducer is suitable for use at a single frequency, such as a sounder and ringer, and preferably includes a unimorph-type diaphragm 1, a case 10, and a lid plate 20.

Figure 5:
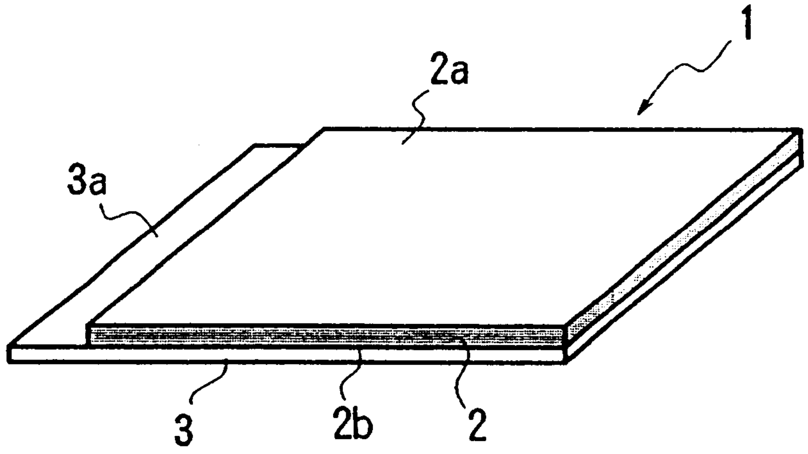
FIG. 5 is a perspective view of a piezoelectric diaphragm used in the piezoelectric electroacoustic transducer shown in FIG. 1.

The diaphragm 1, as shown in FIG. 5, includes a substantially square piezoelectric plate 2, which is polarized in the thickness direction and has thin-film or thick-film electrodes 2*a* and 2*b* provided on top and back surfaces thereof, and a substantially rectangular metallic plate 3 having substantially same width as that of the piezoelectric plate 2 and a slightly greater length than that of the piezoelectric plate 2, which is bonded to the back-surface electrode 2*b* of the piezoelectric plate 2 via a conductive adhesive. In addition, the metallic plate 3 may be directly joined to the back surface of the piezoelectric plate 2 via the conductive adhesive so as to omit the back-surface electrode 2*b*. According to the first preferred embodiment, the piezoelectric plate 2 is bonded to the metallic plate 3 at a location that is shifted to one side of the metallic plate 3 in the longitudinal direction so as to have an exposure portion 3*a*, in which the metallic plate 3 is exposed, in the longitudinal direction toward the other side of the metallic plate 3.

For the piezoelectric plate 2, piezoelectric ceramics such as PZT are preferably used. Preferably, the material of the metallic plate 3 should have high conductivity and spring elasticity as well, and moreover, preferably, the material should have a Young's modulus close to that of the piezoelectric plate 2, such as phosphor bronze and 42Ni. According to the first preferred embodiment, a substantially rectangular material made of 42Ni with a length of about 10 mm, a width of about 10 mm, and a thickness of about 0.05 mm, and having a thermal expansion coefficient close to that of ceramic (PZT, etc.) is preferably used for the metallic plate 3. For the piezoelectric plate 2, a substantially rectangular PZT plate with a length of about 8 mm, a width of about 10 mm, and a thickness of about 0.05 mm is preferably used.

The case 10, which is preferably made of an insulating material such as ceramics and a resin, has a substantially rectangular box-shape having a bottom wall 10*a* and four sidewalls 10*b* to 10*e*. When forming the case 10 of a resin, a heat-resistant resin is preferable, such as an LCP (liquid crystal polymer), SPS (syndiotactic polystyrene), PPS (polyphenylene sulfide), and an epoxy resin. In internal peripheries of the four sidewalls 10*b* to 10*e*, steps 10*f* are provided in an annular arrangement. Over the steps 10*f* inside the two opposing sidewalls 10*b* and 10*d*, internal connections 11*a* and 12*a* of a pair of terminals 11 and 12, which are terminal electrodes, are exposed. The terminals 11 and 12 are formed in the case 10 by insert molding, in which external connections 11*b* and 12*b* protruding outside the case 10 are bent along external surfaces of the sidewalls 10*b* and 10*d* toward the bottom wall 10*a* of the case 10. According to the first preferred embodiment, the internal connections 11*a* and 12*a* of the terminals 11 and 12 are respectively two-forked. These two-forked internal connections 11*a* and 12*a* are positioned in the vicinities of both ends of the steps 10*f*, while having inverted substantially triangular shapes.

Figure 3:
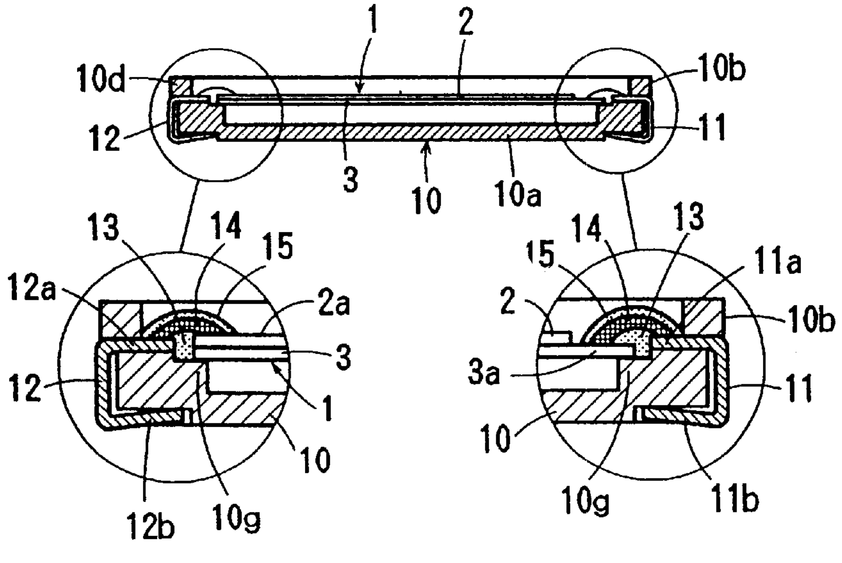
FIG. 3 is a step sectional view along the line A—A of FIG. 2.

Inside the steps 10*f*, as shown in FIG. 3, an annular supporting member 10*g* for supporting the periphery of the diaphragm 1 is provided at a location that is lower than the steps 10*f* by one step. Therefore, when placing the diaphragm 1 on the supporting member 10*g*, the height of the top surface of the diaphragm 1 is substantially equal to the height of the top surfaces of the internal connections 11*a* and 12*a* of the terminals 11 and 12.

Figure 1:
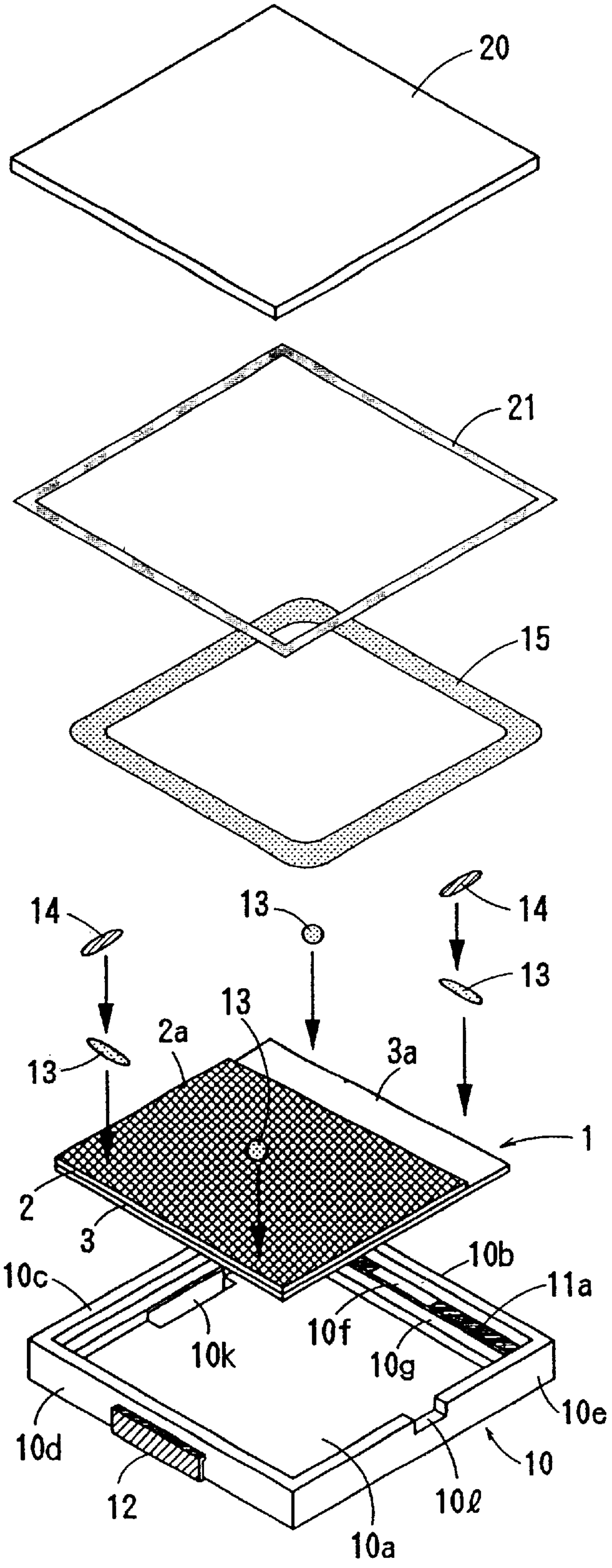
FIG. 1 is an assembly view of a piezoelectric electroacoustic transducer according to a first preferred embodiment of the present invention.
Figure 2:
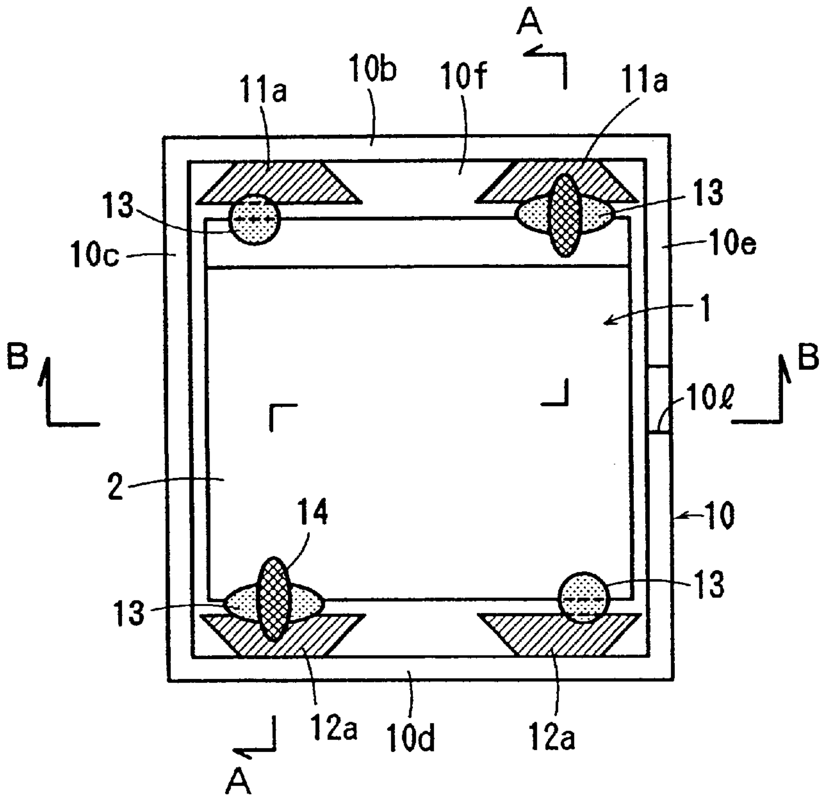
FIG. 2 is a plan view of the piezoelectric electroacoustic transducer shown in FIG. 1 in a state that a lid plate and a second adhesive are removed.
Figure 4:
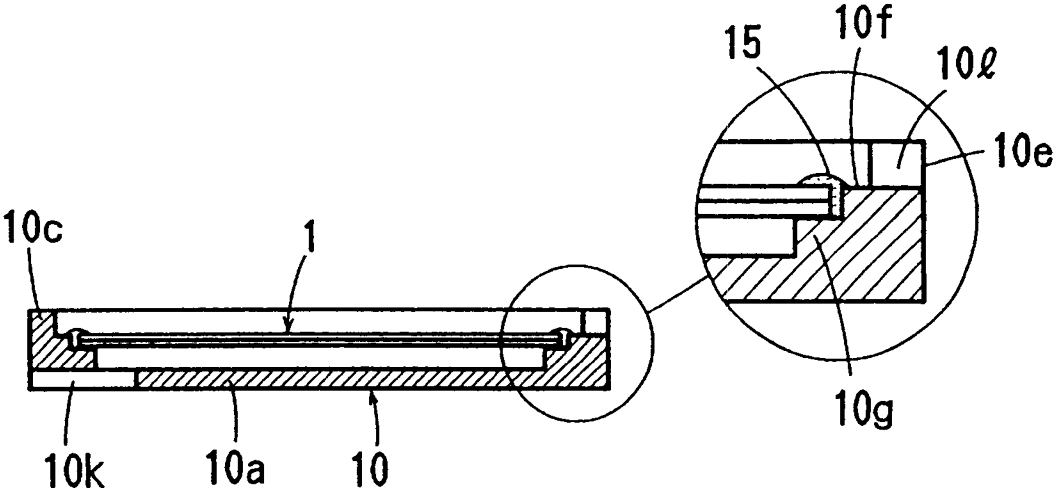
FIG. 4 is a sectional view along the line B—B of FIG. 2.

In addition, the bottom wall 10*a* is provided with a first sound-releasing hole 10*k* thereon, and at the upper edge of the sidewall 10*e*, a notch 101 defining a second sound-releasing hole is provided (see FIGS. 1 and 4).

The diaphragm 1 is accommodated within the case 10 such that the metallic plate 3 faces the bottom wall 10*a* of the case 10 and four sides of the diaphragm 1 are placed on the supporting member 10*g* of the case 10. In the vicinities of four corners of the diaphragm 1 are bonded and fixed with elastic supporting materials (first adhesives) 13. That is, intermediate portions between the vicinities of both ends of the exposure portion 3*a* and the internal connection 11*a* of the terminal 11, i.e., the shortest connecting routes between the exposure portion 3*a* and the internal connection 11*a* are bonded with the elastic supporting materials 13, and portions between the vicinities of both ends of the opposing side and the internal connection 12*a* of the terminal 12 are bonded with the elastic supporting materials 13. According to the first preferred embodiment, the elastic supporting materials 13 applied at one pair of diagonally opposing corners of the diaphragm 1 are ellipses or ovals longitudinally aligned in the lateral direction of the diaphragm 1, while the elastic supporting materials 13 applied to the other pair corners are substantially circular drop-shapes. However, the present invention is not limited to these configurations. The urethane adhesive having a Young's modulus after curing of about $3.7\times10^{6}$ Pa may be used as the elastic supporting material 13, for example. Since the viscosity of the elastic supporting material 13 before curing is greater (about 50 to about 120 dpa·s, for example) than that of an elastic sealant 15, which will be described later, so as to be difficult to spread, the elastic supporting material 13 rises in a bell-shape when it is applied. After applying the elastic supporting material 13, it is heated and cured.

In addition, as a method for fixing the diaphragm 1, after accommodating the diaphragm 1 within the case 10, the elastic supporting material 13 is applied by a dispenser, or other suitable method, alternatively, the diaphragm 1 may be coated with the elastic supporting materials 13 in advance, and then accommodated in the case 10.

The diaphragm 1 fixed to the case 10 with the elastic supporting materials 13 and the internal connections 11a and 12a of the terminals 11 and 12 are electrically connected together via conductive adhesive 14. That is, the conductive adhesive 14 is applied in a substantially elliptic shape on the elastic supporting materials 13 applied at one pair of diagonally opposing corners of the diaphragm 1 in substantially elliptical or oval shapes, so as to intersect with the elastic supporting materials 13. Since the elastic supporting materials 13 rise in bell-shapes, the conductive adhesives 14 are applied by detouring from the shortest connecting routes between the diaphragm 1 and the internal connections 11a and 12a. At this time, precautions must be taken to prevent the conductive adhesives 14 from sticking to gaps between the diaphragm 1 and the internal connections 11a and 12a where the elastic supporting materials 13 are not applied.

A urethane conductive paste having a Young's modulus after curing of about $0.3\times10^9$ Pa may be used as the conductive adhesive 14, for example. After the conductive adhesive 14 is applied, it is heated and cured.

The gap between the entire periphery of the diaphragm 1 and the internal periphery of the case 10 is sealed with the elastic sealant (second adhesive) 15, such that air leakage between the top and back surfaces of the diaphragm 1 is prevented. After applying the elastic sealant 15 in an annular arrangement, it is heated and cured. According to the first preferred embodiment, the silicone adhesive having a Young's modulus after curing of about $3.0\times10^5$ Pa is used as the elastic sealant 15, for example.

After fixing the diaphragm 1 to the case 10 as described above, the lid plate 20 is bonded to the upper opening of the case 10 with an adhesive 21. The lid plate 20 is preferably made of the same material as that of the case 10. By bonding the lid plate 20, an acoustic space is defined between the lid plate 20 and the diaphragm 1.

In the manner described above, the surface-mount piezoelectric electroacoustic transducer is completed.

When a predetermined alternating signal (alternating current signal or rectangular-wave signal) is applied to the terminals 11 and 12 provided in the case 10, the diaphragm 1 vibrates in an area-bending mode so as to generate a desired sound, because four sides of the diaphragm 1 are fixed to the supporting member 10g of the case 10. The generated sound is released outside via the sound-releasing hole provided between the lid plate 20 and the notch 101 of the case 10.

In the description above, the diaphragm 1 is fixed such that the metallic plate 3 faces the bottom wall 10a of the case 10. However, the diaphragm 1 may be fixed such that the piezoelectric plate 2 faces the bottom wall 10a of the case 10. When fixing the diaphragm 1 such that the metallic plate 3 faces the bottom wall 10a, since the surface electrode 2a of the piezoelectric plate 2 and the exposure portion 3a of the metallic plate 3 are exposed upwardly, the connection between the exposure portion 3a and the terminal 11 and the connection between the surface electrode 2a and the terminal 12 are simply performed using the conductive adhesive 14. In addition, when connecting the surface electrode 2a and the terminal 12, a poor connection is produced if the conductive adhesive 14 sticks to the metallic plate 3. However, the elastic supporting material 13 extends into the gap between the diaphragm 1 and the case 10 so as to prevent the conductive adhesive 14 from sticking to the metallic plate 3, thus, preventing a poor connection.

FIGS. 6 to 11 show a piezoelectric electroacoustic transducer according to a second preferred embodiment of the present invention.

The electroacoustic transducer according to the second preferred embodiment is preferably used at wide-range frequencies, such as a piezoelectric receiver.

The electroacoustic transducer preferably includes a layered structure diaphragm 30, a case 10, and the lid plate 20. The configurations other than the case 10 and the diaphragm 30 are substantially the same as those of the first preferred embodiment shown in FIGS. 1 to 5, such that like reference characters designate like portions, and description thereof is omitted.

Figure 8:
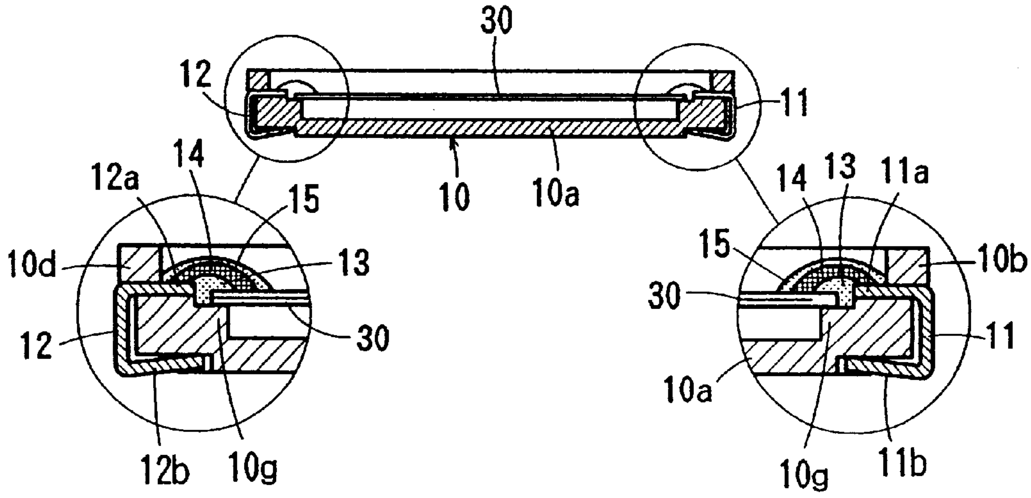
FIG. 8 is a step sectional view along the line C—C of FIG. 7.
Figure 9:
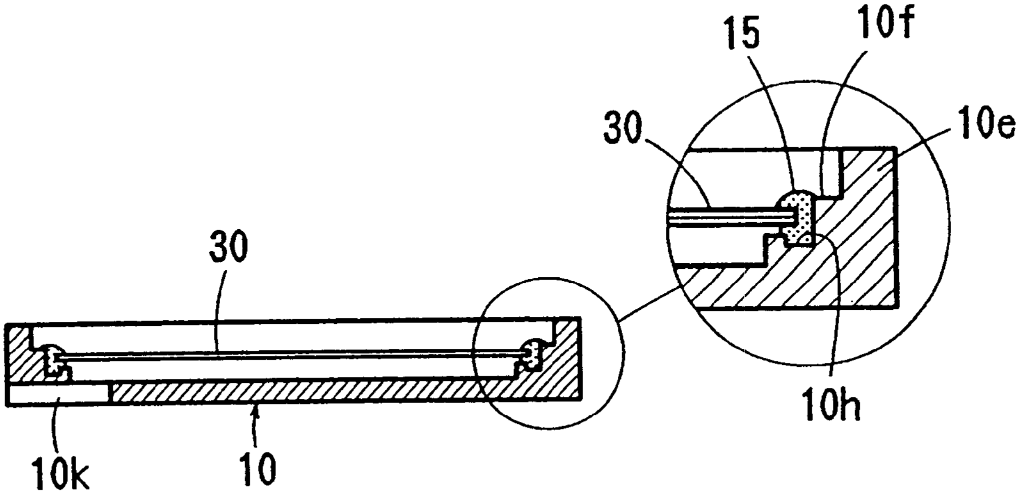
FIG. 9 is a sectional view along the line D—D of FIG. 7.

The differences between the case 10 of the second preferred embodiment and the case 10 according to the first preferred embodiment are shown in FIG. 8, the supporting members 10g are provided only inside the two sidewalls 10b and 10d opposing each other. As shown in FIG. 9, grooves 10h for preventing the flow of an elastic sealant are provided at locations below the supporting members 10g inside the other two sidewalls 10c and 10e, and the lid plate 20 includes a sound-releasing hole 23 provided therein.

Figure 10:
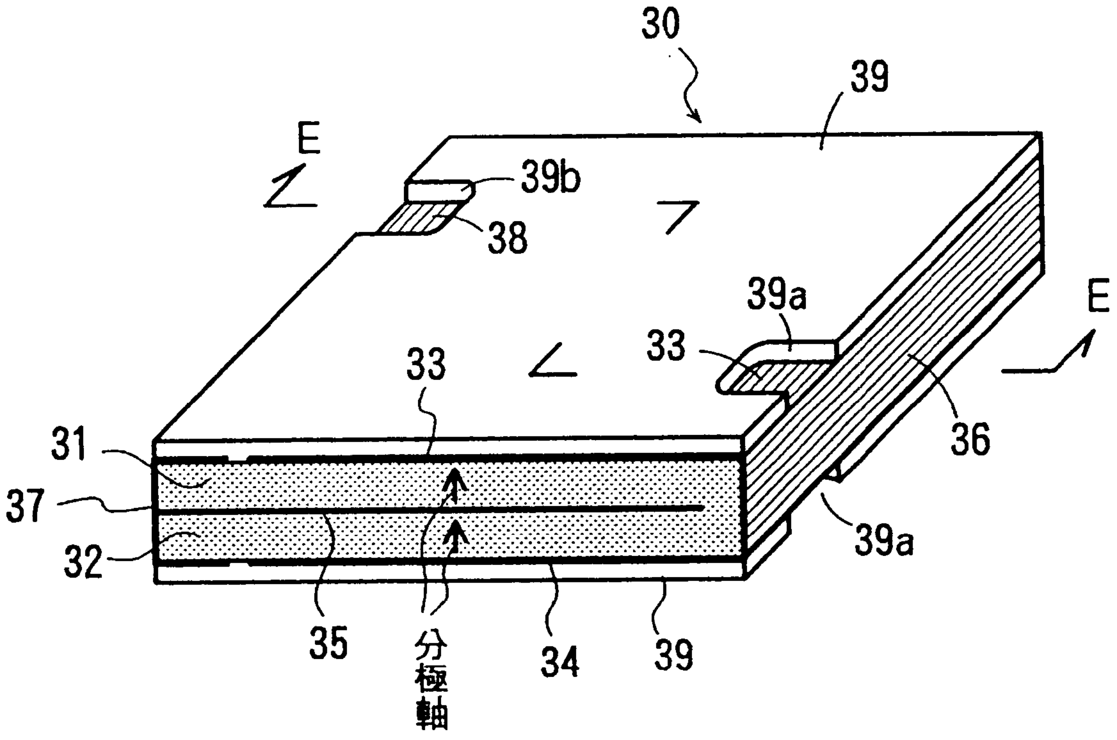
FIG. 10 is a perspective view of a piezoelectric diaphragm used in the piezoelectric electroacoustic transducer shown in FIG. 6.
Figure 11:
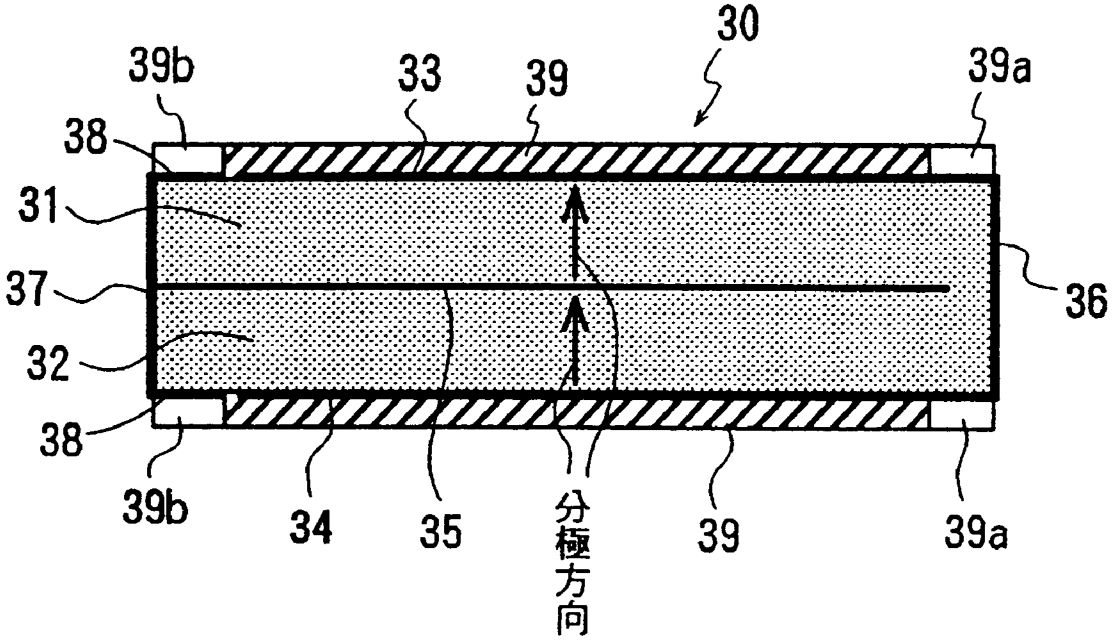
FIG. 11 is a step sectional view along the line E—E of FIG. 10.

The diaphragm 30, as shown in FIGS. 10 and 11, is defined by two piezoelectric ceramic layers 31 and 32, and is provided with principal-surface electrodes 33 and 34 provided on top and bottom principal surfaces and an internal electrode 35 provided between the ceramic layers 31 and 32. The two ceramic layers 31 and 32, as shown by the thick-line arrow in FIG. 11, are polarized in one thickness direction. The topside principal-surface electrode 33 and the bottom-side principal-surface electrode 34 are slightly smaller than the side length of the diaphragm 30, and one end thereof is connected to an end surface electrode 36 provided on one end surface of the diaphragm 30. Therefore, the top and bottom-sides principal-surface electrodes 33 and 34 are connected to each other. The internal electrode 35 is provided substantially symmetrically with the principal-surface electrodes 33 and 34, and one end of the internal electrode 35 is separated from the end surface electrode 36 while the other end is connected to an end surface electrode 37 provided on the other end surface of the diaphragm 30. In addition, on top and bottom surfaces of the diaphragm 30 at the other end, auxiliary electrodes 38 for electrically connecting to the end surface electrode 37 are provided.

On the top and bottom-surfaces of the diaphragm 30, resin layers 39 are arranged to cover the principal-surface electrodes 33 and 34. The resin layer 39 is provided for increasing the shatter strength, because the diaphragm 30 is made of only ceramics. On the top and bottom resin layers 39, cut-outs 39a which expose the principal-surface electrodes 33 and 34 and cut-outs 39b which expose the auxiliary electrodes 38 are provided in the vicinities of corners diagonally opposing each other of the diaphragm 30.

In addition, the cut-outs 39a and 39b may be provided on one of the top and bottom surfaces. However, to eliminate the top and bottom directionality, the cut-outs 39a and 39b are provided on both surfaces according to the second preferred embodiment.

The auxiliary electrode 38 is not necessarily a band electrode having a desired width, and it may be provided only at a position corresponding to the cut-out 39b.

According to the second preferred embodiment, PZT ceramics having a size of about 10 mm×about 10 mm×about 20 $\mu$m are used as the ceramic layers 31 and 32, and a polyamidoimide resin with a thickness of about 5 $\mu$m to about 10 $\mu$m is used as the resin layer 39.

The diaphragm 30 is accommodated within the case 10 and fixed to the supporting members 10*g* of the case 10 with four elastic supporting materials 13. The elastic supporting materials 13 are applied in elongated elliptical shapes between the principal-surface electrode 33 that is exposed from the cut-out 39*a* and the internal connection 11*a* of the terminal 11, and between the auxiliary electrode 38 that is exposed from the cut-out 39*b*, which diagonally opposes the cut-out 39*a*, and the internal connection 12*a* of the terminal 12. At two remaining locations, the elastic supporting materials 13 are also applied in elongated, substantially elliptical shapes. Then, the elastic supporting materials 13 are heated and cured.

In addition, as a method for fixing the diaphragm 30, after accommodating the diaphragm 30 within the case 10, the elastic supporting material 13 is applied by a dispenser, or other suitable method. Alternatively, the diaphragm 30 may be coated with the elastic supporting material 13 before being accommodated within the case 10.

After curing the elastic supporting materials 13, the conductive adhesives 14 are applied in substantially elliptic shapes on the elastic supporting materials 13 applied in substantially elliptic shapes so as to intersect with the elastic supporting materials 13, such that the principal-surface electrode 33 and the internal connection 11*a* of the terminal 11 are connected together and the auxiliary electrode 38 and the internal connection 12*a* of the terminal 12 are also connected together. That is, the conductive adhesives 14 are applied thereon by detouring from the shortest connecting routes between the diaphragm 30 and the internal connections 11*a* and 12*a*. After the conductive adhesive 14 is applied, it is heated and cured.

After the conductive adhesives 14 are applied and cured, the elastic sealant 15 is applied to a gap between the diaphragm 30 and the internal periphery of the case 10 so as to seal the clearance. At this time, as shown in FIG. 9, the elastic sealant 15 is received in the grooves 10*h* provided inside the sidewalls 10*c* and 10*e*, such that the elastic sealant 15 cannot flow down toward the bottom wall 10*a*. Therefore, the diaphragm 30 and the case 10 are securely sealed together.

In the electroacoustic transducer according to the second preferred embodiment, by applying a predetermined alternating voltage to the terminals 11 and 12, the diaphragm 30 flexurally vibrates. The piezoelectric ceramic layer, polarized in the same direction as that of an electric field, contracts in a planar direction while the piezoelectric ceramic layer, polarized in the opposite direction to that of an electric field, expands in the planar direction, such that the entire structure bends in the thickness direction.

According to the second preferred embodiment, since the diaphragm 30 is defined by a deposited ceramic structure without a metallic plate, and two vibrating regions sequentially arranged in the thickness direction vibrate in directions opposite to each other to produce an increased displacement, i.e., increased sound pressure is obtained as compared with a unimorph-type diaphragm.

According to the second preferred embodiment, the supporting members are provided in the two sides of the case along the entire length thereof. Alternatively, as the case 10 shown in FIG. 12, supporting members 10*i* may be provided at four corners. In this case, the four corners of the diaphragm 30 are fixed to the supporting members 10*i* with the elastic supporting materials 13. By supporting the diaphragm 30 only at the corners, the resonance frequency is reduced, such that the sound pressure in a low-frequency range is greatly increased.

Figure 6:
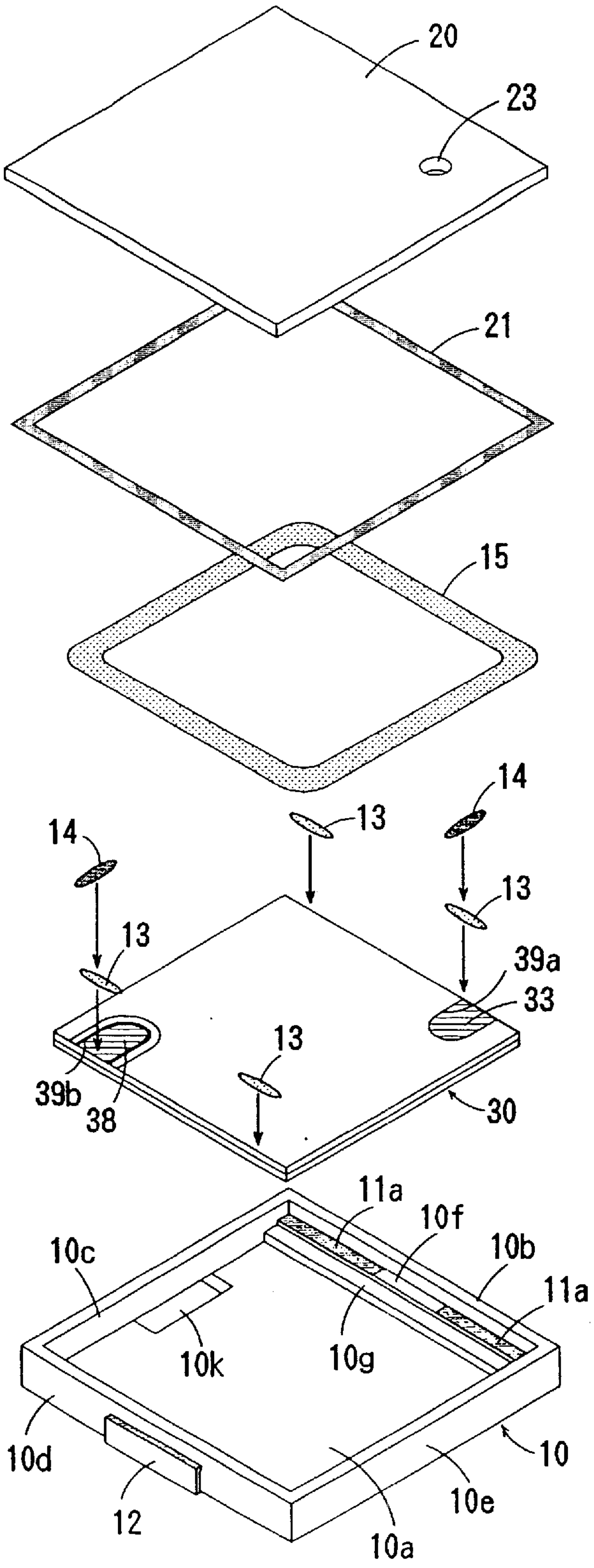
FIG. 6 is an assembly view of a piezoelectric electroacoustic transducer according to a second preferred embodiment of the present invention.
Figure 7:
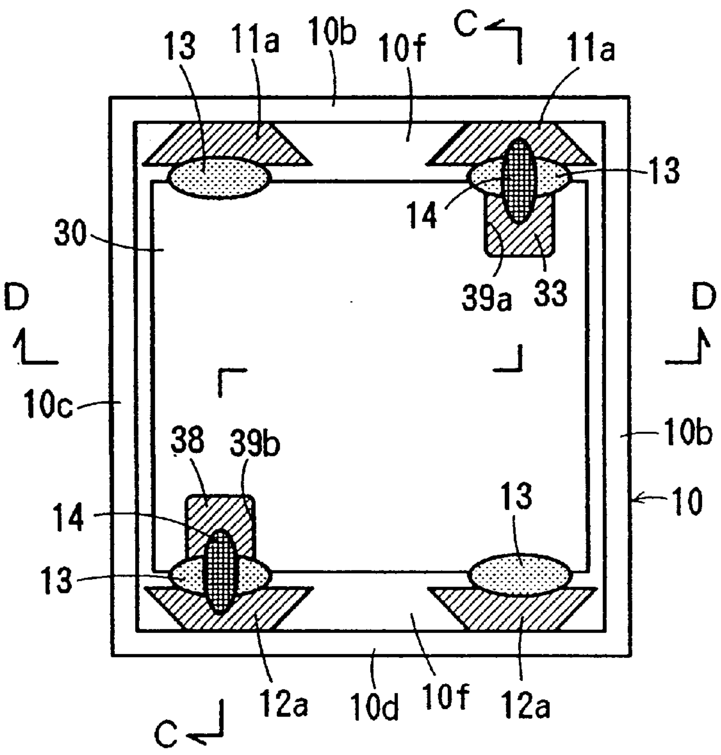
FIG. 7 is a plan view of the piezoelectric electroacoustic transducer shown in FIG. 6 in a state that the lid plate and the second adhesive are removed.
Figure 12:
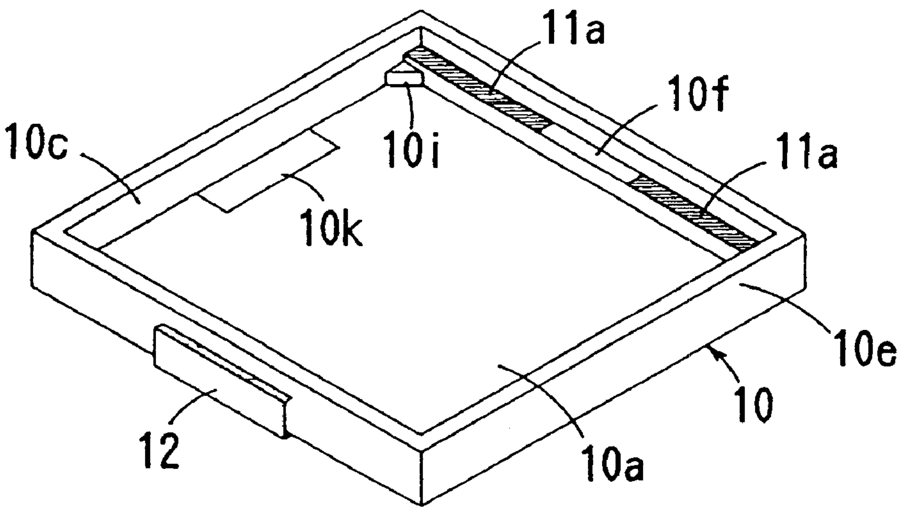
FIG. 12 is a perspective view of a modification of a case.

In addition, in FIGS. 6 and 12, the steps 10*f* having small widths and the grooves 10*h* (see FIG. 9) provided inside the sidewalls 10*c* and 10*e* are omitted from the drawings.

The present invention is not limited to the preferred embodiments described above and can be modified within the sprit and scope of the invention.

For example, the diaphragm 30 is preferably defined by two piezoelectric ceramic layers. Alternatively, the diaphragm may be defined by three or more piezoelectric ceramic layers.

The diaphragms 1 and 30 may be any one of substantially square and substantially rectangular shapes.

According to the first preferred embodiment, the unimorph-type diaphragm, in which the piezoelectric plate is bonded on one surface of the metallic plate, is described. However, a bimorph-type diaphragm may be used, in which the piezoelectric plate is bonded on both surfaces of the metallic plate.

According to the preferred embodiments, the supporting member of the case is provided at a location below than the internal connections of the terminal electrodes by one step, such that the diaphragm supported by the supporting member of the case and the internal connections are substantially the same in height. Alternatively, the height of the supporting member of the case and the internal connections may be substantially the same so as to fix the diaphragm thereon.

The terminal electrode according to the present invention is not limited to the insert-molded terminal as in the preferred embodiments, and may be a thin-film or thick-film electrode extending from the upper surface of the supporting member of the case toward the outside, for example.

According to the preferred embodiments, the first adhesive (elastic supporting material) is preferably a material that is more difficult to spread than the second adhesive, however, the same material may be used.

The applying locations of the first adhesives are not limited to the vicinities of four corners of the diaphragm, to which the adhesives are partially applied, and the adhesives may be continuously applied to two opposing sides of the diaphragm along the entire length thereof.

The applying positions of the conductive adhesives are not limited to two corners diagonally opposing each other of the diaphragm, and the conductive adhesives may be applied to any position as long as the electrode of the diaphragm extend outside.

The case according to the present invention is not limited to a case having a concave section and the lid plate to be bonded on the upper surface thereof as in the preferred embodiments.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric electroacoustic transducer comprising:

a substantially square piezoelectric diaphragm having electrodes and flexurally vibrating in a plate-thickness direction in response to application of an alternating signal to the electrodes;

a substantially rectangular insulating case having a supporting member disposed inside sidewalls of the case for supporting the piezoelectric diaphragm;

terminal electrodes having internal connections exposed in a vicinity of the supporting member and external connections exposed on the external surface of the case and electrically connecting to the internal connections;

a first adhesive, which is applied to a shortest connecting route between the piezoelectric diaphragm and the internal connections, the shortest connecting route being located between the external periphery of the piezoelectric diaphragm and the internal connections, so as to fix the piezoelectric diaphragm to the case;

a conductive adhesive for electrically connecting the electrodes of the piezoelectric diaphragm to the internal connections of the terminal electrodes, the conductive adhesive being applied between the electrodes of the piezoelectric diaphragm and the internal connections via an upper surface of the first adhesive by detouring from the shortest connecting route between the piezoelectric diaphragm and the internal connections; and a second adhesive for sealing a gap between the external periphery of the piezoelectric diaphragm and the internal periphery of the case; wherein the first and second adhesives have a Young's modulus after curing that is less than that of the conductive adhesive.

2. A transducer according to claim 1, wherein a viscosity of the first adhesive before curing is greater than that of the second adhesive so as to prevent spreading of the first adhesive.

3. A transducer according to claim 1, wherein the first adhesive is partially applied to vicinities of four corners of the piezoelectric diaphragm.

4. A transducer according to claim 3, wherein the conductive adhesive is applied to vicinities of at least two of four corners of the piezoelectric diaphragm.

5. A transducer according to claim 1, wherein the supporting member is provided inside at least two opposing sidewalls of the case.

6. A transducer according to claim 1, wherein the supporting member is provided inside only two opposing sidewalls of the case such that no supporting member is provided inside the remaining two opposing sidewalls of the case.

7. A transducer according to claim 1, wherein the supporting member is provided inside of each of the sidewalls of the case.

8. A transducer according to claim 1, wherein the substantially square piezoelectric diaphragm is a unimorph piezoelectric diaphragm.

9. A transducer according to claim 1, wherein the substantially square piezoelectric diaphragm is a bimorph piezoelectric diaphragm.

10. A transducer according to claim 1, wherein the first adhesive is a urethane adhesive having a Young's modulus after curing of about $3.7\times10^6$.

11. A method for manufacturing a piezoelectric electroacoustic transducer comprising the steps of:

preparing a substantially square piezoelectric diaphragm having electrodes and flexurally vibrating in a plate-thickness direction in response to application of an alternating signal to the electrodes;

preparing a substantially rectangular insulating case having a supporting member disposed inside sidewalls of the case for supporting the piezoelectric diaphragm and terminal electrodes having internal connections exposed in a vicinity of the supporting member and external connections exposed outside the case and electrically connecting to the internal connections;

applying a first adhesive to a shortest connecting route between the piezoelectric diaphragm and the internal connections, the shortest route being located between the external periphery of the piezoelectric diaphragm and the internal connections, so as to fix the piezoelectric diaphragm to the case by curing the first adhesive;

applying a conductive adhesive between the electrodes of the piezoelectric diaphragm and the internal connections via the upper surface of the first adhesive by detouring from the shortest connecting route between the piezoelectric diaphragm and the internal connections so as to electrically connect the electrodes of the piezoelectric diaphragm to the internal connections of the terminal electrodes by curing the conductive adhesive; and applying a second adhesive to a gap between the external periphery of the piezoelectric diaphragm and the internal periphery of the case so as to seal the gap between the peripheries by curing the second adhesive; wherein the first and second adhesives have a Young's modulus after curing that is less than that of the conductive adhesive.

12. A method according to claim 11, wherein a viscosity of the first adhesive before curing is greater than that of the second adhesive so as to prevent spreading of the first adhesive.

13. A method according to claim 11, wherein the first adhesive is partially applied to vicinities of four corners of the piezoelectric diaphragm.

14. A method according to claim 13, wherein the conductive adhesive is applied to vicinities of at least two of four corners of the piezoelectric diaphragm.

15. A method according to claim 11, wherein the supporting member is provided inside at least two opposing sidewalls of the case.

16. A method according to claim 11, wherein the supporting member is provided inside only two opposing sidewalls of the case such that no supporting member is provided inside the remaining two opposing sidewalls of the case.

17. A method according to claim 11, wherein the supporting member is provided inside of each of the sidewalls of the case.

18. A method according to claim 11, wherein the substantially square piezoelectric diaphragm is a unimorph piezoelectric diaphragm.

19. A method according to claim 11, wherein the substantially square piezoelectric diaphragm is a bimorph piezoelectric diaphragm.

20. A method according to claim 11, wherein the first adhesive is a urethane adhesive having a Young's modulus after curing of about $3.7\times10^6$.

* * * * *